(12) United States Patent
Kajihara

(10) Patent No.: US 9,607,867 B2
(45) Date of Patent: Mar. 28, 2017

(54) SUBSTRATE PROCESSING DEVICE AND SUBSTRATE PROCESSING METHOD

(71) Applicant: CANON ANELVA CORPORATION, Kawasaki-shi (JP)

(72) Inventor: Yuji Kajihara, Kawasaki (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 15/137,347

(22) Filed: Apr. 25, 2016

(65) Prior Publication Data

US 2016/0240406 A1 Aug. 18, 2016

Related U.S. Application Data

(63) Continuation of application No. PCT/JP2014/005339, filed on Oct. 21, 2014.

(30) Foreign Application Priority Data

Nov. 18, 2013 (JP) ................................. 2013-237543

(51) Int. Cl.
*H05B 1/02* (2006.01)
*H01L 21/67* (2006.01)
(Continued)

(52) U.S. Cl.
CPC ........ *H01L 21/67109* (2013.01); *C23C 14/58* (2013.01); *F25B 9/002* (2013.01);
(Continued)

(58) Field of Classification Search
CPC ... H01L 21/67109; H01L 43/02; H01L 43/08; H01L 43/10; H01L 43/12; F25B 9/14; F25B 9/002; F25B 9/02; H05B 1/0227
(Continued)

(56) References Cited

U.S. PATENT DOCUMENTS 5,065,698 A * 11/1991 Koike ................... C23C 14/564
118/715
6,602,348 B1 8/2003 Rogelstad
(Continued)

FOREIGN PATENT DOCUMENTS

JP 08-51099 A 2/1996
JP 10-107126 A 4/1998
(Continued)

OTHER PUBLICATIONS

International Search Report issued in PCT/JP2014/005339, dated Dec. 16, 2014 (2 pages).

*Primary Examiner* — Mark Paschall
(74) *Attorney, Agent, or Firm* — Fitzpatrick, Cella, Harper & Scinto

(57) ABSTRACT

The invention provides a substrate processing device and a substrate processing method for cooling a substrate, which are capable of conveying a substrate in a cleaner condition. A substrate cooling device serving as a substrate processing device of an embodiment of the invention includes: a chamber; a cooling unit which performs cooling; a substrate holder which is provided with a substrate mounting surface for mounting a substrate inside the chamber, and is cooled by the cooling unit; and a shield which is provided with a side surface portion surrounding a lateral side of the substrate mounting surface inside the chamber, and is cooled by the cooling unit. Moreover, a shield heater is provided in the vicinity of a surface on the inside of the shield.

11 Claims, 9 Drawing Sheets

(51) Int. Cl.
    *C23C 14/58*     (2006.01)
    *H01L 21/687*    (2006.01)
    *H01L 43/12*     (2006.01)
    *F25B 9/00*      (2006.01)
    *F25B 9/02*      (2006.01)
    *F25B 9/14*      (2006.01)
    *H01L 43/02*     (2006.01)
    *H01L 43/08*     (2006.01)
    *H01L 43/10*     (2006.01)

(52) U.S. Cl.
    CPC ............... *F25B 9/02* (2013.01); *F25B 9/14* (2013.01); *H01L 21/67115* (2013.01); *H01L 21/68742* (2013.01); *H01L 43/02* (2013.01); *H01L 43/08* (2013.01); *H01L 43/10* (2013.01); *H01L 43/12* (2013.01); *H05B 1/0227* (2013.01); *H05B 1/0247* (2013.01)

(58) Field of Classification Search
    USPC .... 219/121.4, 121.43, 121.49; 118/724, 725; 156/345.52
    See application file for complete search history.

(56) References Cited

U.S. PATENT DOCUMENTS

| | | | |
|---|---|---|---|
| 8,430,965 B2* | 4/2013 | Kordina | H01L 21/67109 118/715 |
| 8,987,678 B2* | 3/2015 | Kellogg | H01J 27/16 250/396 R |
| 2002/0144786 A1* | 10/2002 | Chiang | C23C 16/0227 156/345.51 |
| 2003/0186517 A1* | 10/2003 | Takagi | C23C 16/452 438/478 |
| 2004/0065645 A1* | 4/2004 | Welch | H01J 37/32458 219/121.43 |
| 2005/0145341 A1* | 7/2005 | Suzuki | H01J 37/321 156/345.49 |
| 2007/0034154 A1* | 2/2007 | Fink | H01J 37/321 118/723 I |

FOREIGN PATENT DOCUMENTS

| | | |
|---|---|---|
| JP | 11-233598 A | 8/1999 |
| JP | 2010-182766 A | 8/2010 |
| JP | 2011-100901 A | 5/2011 |

* cited by examiner

SUBSTRATE PROCESSING DEVICE AND SUBSTRATE PROCESSING METHOD

CROSS-REFERENCES TO RELATED APPLICATIONS

This application is a continuation application of International Application No. PCT/JP2014/005339, filed Oct. 21, 2014, which claims the benefit of Japanese Patent Application No. 2013-237543 filed Nov. 18, 2013. The contents of the aforementioned applications are incorporated herein by reference in their entireties.

TECHNICAL FIELD

The present invention relates to a device and a method for cooling a substrate inside a vacuum chamber.

BACKGROUND ART

There has been known a substrate processing system apparatus of either a cluster type or an in-line type, which is provided with multiple processing chambers in order to continuously perform multiple procedures of film formation processing, etching processing, and the like on substrates. The film formation processing and the etching processing generally take place under a high temperature. Accordingly, in some cases, the substrate processing system may be provided with a cooling chamber (hereinafter also referred to as a substrate cooling device) for cooling a substrate, having being subjected to the film formation processing or the etching processing, down to a predetermined temperature. By conveying the substrate after the film formation processing or the etching processing to the cooling chamber, and cooling the substrate in the cooling chamber, it is possible to shorten waiting time until the substrate is cooled down to the predetermined temperature.

Patent Document 1 discloses an exemplary cooling chamber. The cooling chamber described in Patent Document 1 includes an upper cooling member provided to a chamber inner wall and a lower cooling member provided to a substrate holder. The cooling chamber can quickly cool the substrate by sandwiching a top surface and a bottom surface of the substrate between the upper cooling member and the lower cooling member.

CITATION LIST

Patent Document

Patent Document 1: Japanese Patent Application Laid-Open No. Hei 10-107126

SUMMARY OF INVENTION

The cooling chamber described in Patent Document 1 is maintained as a vacuum by using a vacuum pump in order to prevent the substrate from oxidation and contamination. Under vacuum, a substrate holder cooled at a low temperature functions like as a vacuum pump and adsorbs gas molecules such as water molecules onto its surface. On the other hand, a substrate conveyed from the outside into the cooling chamber has a high temperature. For this reason, when the substrate approaches the substrate holder while being conveyed, the substrate imparts thermal energy to the gas molecules adsorbed onto the substrate holder, whereby part of the gas molecules are freed from the substrate holder and released into a space in the vicinity of the substrate. As a result, the gas molecules could adhere onto a top surface of the substrate. While the technique of Patent Document 1 is applied to the case where the high-temperature substrate is mounted on the water-cooled substrate holder, the same phenomenon occurs also in the case where a substrate at a room temperature (0° C. to 50° C.) is mounted on a substrate holder cooled to −100° C. or below.

Even if the gas molecules adsorbed onto the substrate holder are removed by cleaning the inside of the cooling chamber once, other gas molecules are brought from the outside into the cooling chamber in the course of conveying a substrate. Accordingly, the gas molecules adsorbed onto the substrate holder are increased again along with processing of multiple substrates.

The present invention has been made to solve the above-mentioned problems. An object of the present invention is to provide a substrate processing device and a substrate processing method for cooling a substrate, which are capable of conveying a substrate in a cleaner condition.

A first aspect of the present invention is a substrate processing device comprising: a chamber with inside capable of being evacuated; a substrate holder provided inside the chamber and including a substrate mounting surface capable of cooling a substrate; a shield provided inside the chamber and including a side wall portion provided to surround a lateral side of the substrate mounting surface; and shield cooling unit for cooling the shield.

According to the substrate processing device of the present invention, the shield is cooled by the shield cooling unit and the shield is provided with the side wall portion which surrounds the lateral part of the substrate mounting surface. Thus, it is possible to trap gas molecules, which are released from the substrate holder at the time of conveyance of the substrate, onto the side wall portion of the shield, and thus to reduce contamination of the substrate by the gas molecules.

DESCRIPTION OF EMBODIMENTS

Figure 1:
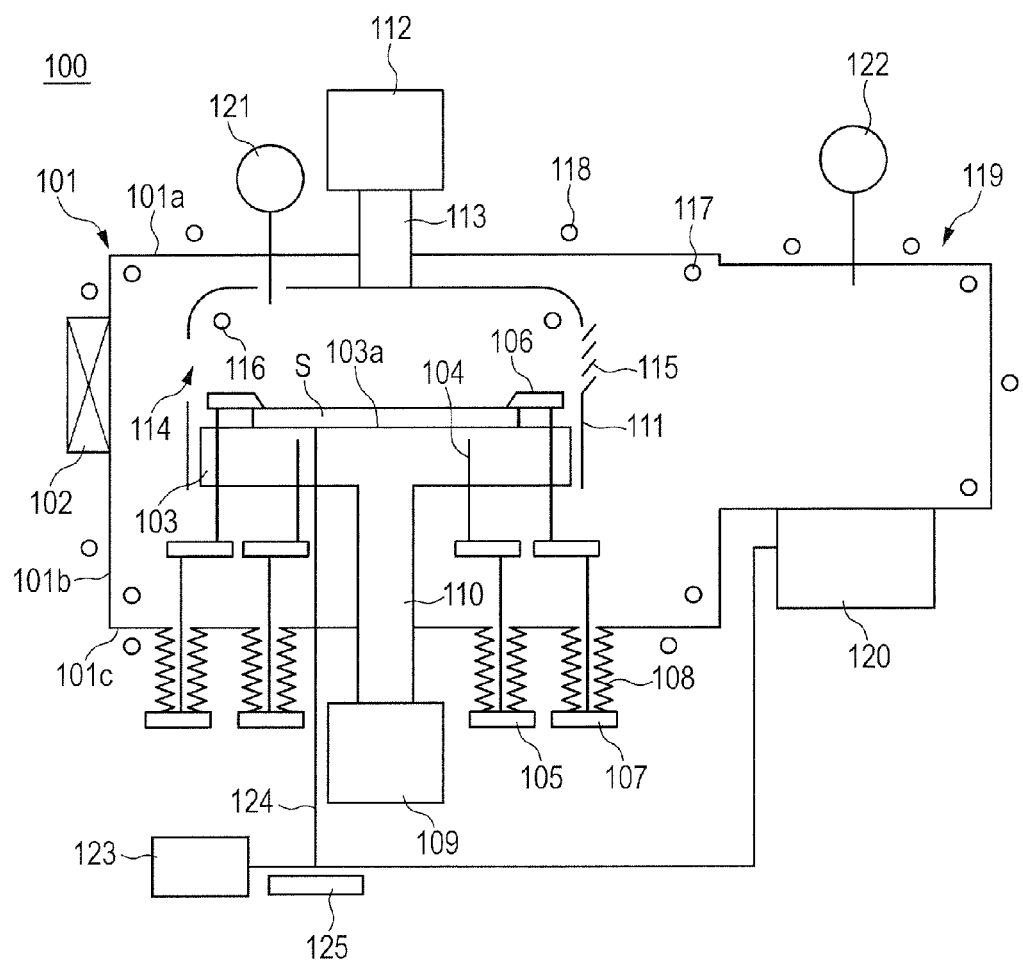
FIG. 1 is a schematic configuration diagram showing a substrate cooling device according to an embodiment of the present invention.

Embodiments of the present invention will be described below with reference to the drawings. It is to be noted, however, that the present invention is not limited only to these embodiments. In the drawings to be described below, constituents having the same functions are denoted by the same reference numerals and duplicate explanation thereof may be omitted as appropriate.

First Embodiment

FIG. 1 is a schematic configuration diagram showing a substrate cooling device 100 of this embodiment, which serves as a substrate processing device configured to cool a substrate. The substrate cooling device 100 includes a chamber 101 and an exhaust chamber 119. An upper wall 101a of the chamber 101 is detachably provided, so that maintenance work, cleaning, and the like can be performed while detaching the upper wall 101a. A gate valve 102 is openably and closably provided to a side wall 101b of the chamber 101, so that a substrate S can be conveyed into and out of the chamber 101 through the gate valve 102. A substrate holder 103 having a substrate mounting surface 103a is provided inside the chamber 101. The substrate S can be mounted on the substrate mounting surface 103a.

The substrate holder 103 is provided with a rod-like lift pin 104 for supporting a bottom surface of the substrate S while penetrating the substrate mounting surface 103a. By using a lift pin drive mechanism 105, the lift pin 104 can be elevated or lowered along a normal direction of the substrate S or the substrate mounting surface 103a. In addition, the substrate holder 103 is provided with a mechanical chuck 106 for fixing an outer peripheral portion of a top surface of the substrate S. By using a mechanical chuck drive mechanism 107, the mechanical chuck 106 can be elevated and lowered along the normal direction of the substrate S or the substrate mounting surface 103a. Each of the lift pin drive mechanism 105 and the mechanical chuck drive mechanism 107 is arbitrary driving means such as a motor and an actuator. Expandable bellows 108 are provided between the lift pin 104 and the lift pin drive mechanism 105, and between the mechanical chuck 106 and the mechanical chuck drive mechanism 107, so that the lift pin 104 and the mechanical chuck 106 can move while maintaining a hermetically sealed state of the chamber 101.

In order to fix the substrate S, an electrostatic adsorption mechanism (ESC) configured to fix the substrate S to the substrate holder 103 by using an electrostatic force may be provided instead of the mechanical chuck 106 and the mechanical chuck drive mechanism 107.

A substrate holder cooling unit 109 (substrate holder cooling means) provided outside the chamber 101 is connected to the substrate holder 103 via a substrate holder support column 110 that penetrates a lower wall 101c of the chamber 101. The substrate S mounted on the substrate mounting surface 103a can be cooled by maintaining the substrate holder 103 at a low temperature by using the substrate holder cooling unit 109. The substrate holder cooling unit 109 includes a not-illustrated temperature measurement unit (such as a thermocouple) for measuring the temperature of the substrate holder 103. The substrate holder 103 and the substrate holder support column 110 are preferably formed by using highly heat conductive metal such as copper and aluminum.

A shield 111 is provided inside the chamber 101. The shield 111 is provided to surround a lateral side of the substrate holder 103 and to cover an upper side of the substrate holder 103. In other words, the shield 111 is provided to surround a lateral side of the substrate mounting surface 103a and to be opposed to the substrate mounting surface 103a.

A shield cooling unit 112 provided outside the chamber 101 is connected to the shield 111 via a shield support column 113 that penetrates the upper wall 101a of the chamber 101. The shield 111 is maintained at a low temperature by using the shield cooling unit 112. Accordingly, when gas molecules that are released from the substrate holder 103 in the course of conveying the substrate S reach a surface of the shield 111, it is possible to trap the gas molecules, i.e., to hold the gas molecules on the surface. The shield cooling unit 112 includes a not-illustrated temperature measurement unit (such as a thermocouple) for measuring the temperature of the shield 111. The shield 111 and the shield support column 113 are preferably formed by using highly heat conductive metal such as copper and aluminum.

Each of the substrate holder cooling unit 109 and the shield cooling unit 112 (shield cooling means) is cooling means for performing the cooling in accordance with an arbitrary method, which may be a cooling device (such as a Gifford-McMahon refrigerator and a Stirling refrigerator) that performs cooling by use of adiabatic expansion of helium, or a device configured to perform cooling by feeding a refrigerant such as low-temperature liquid nitrogen supplied from outside as a refrigerant therein. In this embodiment, the substrate holder cooling unit 109 and the shield cooling unit 112 are provided as separate members. Instead, these cooling units may be provided collectively as a single cooling unit.

An opening 114 for allowing passage of the substrate S is provided on a side surface of the shield 111 at a portion opposed to the gate valve 102. The substrate S conveyed from the outside of the chamber 101 is passed through the gate valve 102 and the opening 114 of the shield 111, and is mounted on the substrate holder 103. Meanwhile, the cooled substrate S is passed through the opening 114 of the shield 111 and the gate valve 102, and is conveyed to the outside of the chamber 101. In the meantime, a louver 115 is provided on the side surface of the shield 111 at a portion other than the opening 114 in order to cause the inside and the outside of the shield 111 to communicate with each other.

A shield heater 116 is provided in the vicinity of a surface on the inside of the shield 111, i.e., in the vicinity of the surface of the shield 111 opposed to the substrate holder 103. Meanwhile, an in-chamber heater 117 is provided in the vicinity of an inner side of a wall surface of the chamber 101, and an ex-chamber heater 118 is provided in the vicinity of an outer side of the wall surface of the chamber 101. The shield heater 116 and the in-chamber heater 117 are configured to remove the gas molecules adsorbed onto the shield 111 and the chamber 101 by imparting thermal energy thereto, which are preferably heating means such as lamps that can achieve quick heating. On the other hand, the ex-chamber heater 118 is configured to heat the chamber 101 itself, which is preferably heating means such as a sheath heater that can heat a wide range to a high temperature. Although the shield heater 116, the in-chamber heater 117, and the ex-chamber heater 118 are only partially illustrated in FIG. 1, these heaters are provided at given intervals so as to be able to homogeneously heat the corresponding surfaces.

The exhaust chamber 119 is connected to the chamber 101 such that internal spaces thereof can communicate with each other. The exhaust chamber 119 is provided with an exhaust pump 120 as an exhaust unit which can evacuate the inside of the chamber 101. Arbitrary exhaust means such as a dry pump and a turbomolecular pump can be used as the exhaust pump 120 depending on the required degree of vacuum. These pumps may also be used in combination. Moreover, an in-shield vacuum gauge 121 for measuring a pressure inside the shield 111, i.e., in a space defined by the shield 111 is provided to the chamber 101, while an in-chamber vacuum gauge 122 for measuring a pressure inside the exhaust chamber 119 is provided to the exhaust chamber 119.

Furthermore, in order to cool the substrate S efficiently, the substrate cooling device 100 is provided with a cooling gas introduction unit 123 for introducing a cooling gas between the bottom surface of the substrate S and the substrate mounting surface 103a. The cooling gas introduction unit 123 is connected to a gas line 124 which is a pipe for allowing passage of the cooling gas. The gas line 124 penetrates the chamber 101 and the substrate holder 103, and opens to a space between the bottom surface of the substrate S and the substrate mounting surface 103a. As for the cooling gas to be introduced from the cooling gas introduction unit 123, He, Ar, and a mixed gas containing at least one of the above substances can be used. The substrate S can be cooled quickly and homogeneously as a consequence of spreading the cooling gas over the bottom surface of the substrate S. The gas line 124 is also connected to the exhaust pump 120, so that the used cooling gas can be discharged by driving the exhaust pump 120. The gas line 124 includes a not-illustrated variable valve with which a route and a flow rate can be changed. Although FIG. 1 illustrates only one system of the gas line 124, two systems of gas lines, namely, a gas line 124 for introducing the cooling gas from the cooling gas introduction unit 123 and a gas line 124 for discharging the cooling gas may be separately provided. The cooling gas introduction unit 123 preferably includes gas flow rate adjusting means such as a mass flow controller (MFC) and an automatic pressure controller (APC). Note that the cooling gas introduction unit 123 does not always have to be provided. As a matter of course, the substrate S can also be cooled by mounting the substrate S directly on the cooled substrate mounting surface 103a without using the coolant gas described above.

A gas line heater 125 is provided in the vicinity of the gas line 124. By heating the gas line 124 with the gas line heater 125, the gas molecules adsorbed onto an inner surface of the gas line can be efficiently removed. In FIG. 1, the gas line heater 125 is provided only at a certain part of the gas line 124. Instead, the gas line heater 125 may be provided at the entire gas line 124. While arbitrary heating means is applicable to the gas line heater 125, it is possible to use a ribbon heater, for example.

Figure 2:
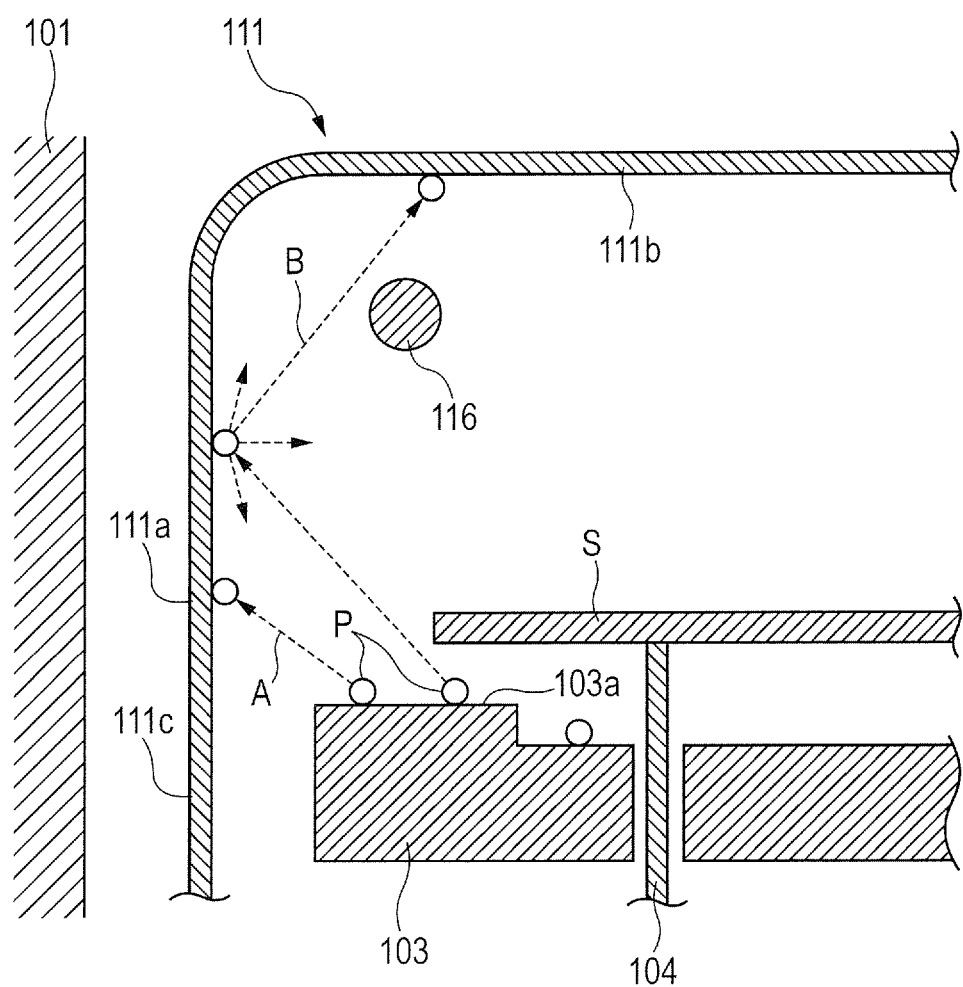
FIG. 2 is a cross-sectional view of a shield according to the embodiment of the present invention.

FIG. 2 is a cross-sectional view of the shield 111 included in the substrate cooling device 100 of this embodiment. The shield 111 includes: a side wall portion 111a which surrounds a lateral side of the substrate S or the substrate mounting surface 103a; an upper wall portion 111b which covers an upper side of the substrate S or the substrate mounting surface 103a; and a skirt wall portion 111c which is located below the lateral side of the substrate S or the substrate mounting surface 103a and surrounds a lateral side of the substrate holder 103. In other words, the side wall portion 111a extends along an end surface of the substrate S or the substrate mounting surface 103a, the upper wall portion 111b is provided opposite to the substrate S or the substrate mounting surface 103a, and the skirt wall portion 111c extends along a side surface of the substrate holder 103. The side wall portion 111a and the skirt wall portion 111c are provided substantially parallel to a normal line of the substrate S or the substrate mounting surface 103a, and the upper wall portion 111b is provided substantially parallel to the substrate S or the substrate mounting surface 103a. In this embodiment, the side wall portion 111a, the upper wall portion 111b, and the skirt wall portion 111c are formed as an integrated member. However, a configuration in which members that are formed separately are connected to one another is also acceptable.

While the inside of the chamber 101 is evacuated to form a vacuum and the substrate holder 103 is cooled, the substrate holder 103 functions as a vacuum pump which adsorbs gas molecules P (inclusive of particulates that behave like a gas) such as water molecules in the space. FIG. 2 illustrates the gas molecules P that are adsorbed onto a top surface of the substrate holder 103. In this state, the substrate S conveyed from the outside of the substrate cooling device 100 has a temperature higher by several hundred degrees relative to the cooled substrate holder 103. For this reason, when the substrate S from the outside is brought close to the substrate mounting surface 103a of the substrate holder 103 in order to mount the substrate S thereon, thermal energy is imparted from the substrate S to the gas molecules P adsorbed onto the top surface of the substrate holder 103, whereby the gas molecules P are released from the top surface of the substrate holder 103.

In general, functional elements are provided on the top surface (i.e., the surface on the opposite side from the substrate holder 103) of the substrate S. Accordingly, adsorption of the gas molecules P onto the top surface of the substrate S is more problematic in light of contamination than adsorption of the gas molecules P onto the bottom surface (i.e., the surface opposed to the substrate holder 103) of the substrate S. Each of the gas molecules P released from the substrate holder 103 to the space maintained as a vacuum travels in a substantially straight line in the space as indicated with a dashed line A in FIG. 2. For this reason, when the cooled shield 111 is not provided around the substrate holder 103 as in the conventional case, the gas molecules P are once adsorbed onto an inner wall and the like of the chamber 101, then are desorbed (released) therefrom with a certain probability, and reach the top surface of the substrate S to serve as a contamination source. On the other hand, since the cooled shield 111 is provided around the substrate holder in the substrate cooling device 100 of this embodiment, each gas molecule P released from the top surface of the substrate holder 103 travels in a substantially straight line and collides with the side wall portion 111a and gets trapped on the side wall portion 111a. This configuration makes it possible to reduce the gas molecules P to be adsorbed onto the top surface of the substrate S and to serve as a contamination source.

Here, a description will be given of a cosine law. It has been known that, when the gas molecules P trapped on the inner wall of the chamber 101 and the shield 111 are released, traveling directions of the gas molecules P exhibit stochastic distribution generally called the cosine law. According to the cosine law, the flight in the normal direction of the trapping surface has the highest probability. According to the cosine law, since the normal line of the side wall portion 111a is parallel to the substrate mounting surface 103a in the case of this embodiment, the highest proportion of the gas molecules P fly in the direction parallel to the substrate mounting surface 103a after desorption of the gas molecules P trapped on the side wall portion 111a. In other words, after desorption of the gas molecules P trapped on the side wall portion 111a, it is less likely that the gas molecules P fly toward a film deposition surface (the top surface) of the substrate S.

As indicated with a dashed line B in FIG. 2, among the gas molecules P there may also be one which is not trapped on the side wall portion 111a or is once trapped thereon but is desorbed thereafter. In this case, such a gas molecule P is desorbed from the side wall portion 111a in accordance with the above-described cosine law. Therefore, the gas molecule P may fly in the normal direction of the side wall portion 111a with a high probability or fly either in a direction toward the substrate mounting surface 103a or in a direction away from the substrate mounting surface 103a with a probability lower than the aforementioned probability. The gas molecule P flying in the normal direction of the side wall portion 111a travels in a substantially straight line and collides with an opposite end of the side wall portion 111a, thereby being trapped on the side wall portion 111a again. Meanwhile, the gas molecule P flying in the direction away from the substrate mounting surface 103a travels in a substantially straight line and collides with the upper wall portion 111b provided at a position opposed to the substrate mounting surface 103a, thereby getting trapped on the upper wall portion 111b. As a result, the majority of the gas molecules P are trapped on the side wall portion 111a or the upper wall portion 111b whereby the number of the gas molecules P that are likely to reach the top surface of the substrate S (i.e., the gas molecules P desorbed from the side wall portion 111a and flying toward the substrate mounting surface 103a) is significantly reduced. Accordingly, since the upper wall portion 111b is provided in addition to the side wall portion 111a together as the shield 111 in this embodiment, it is possible to trap the gas molecules P more reliably than in the case of providing only the side wall portion 111a, and thus to further reduce the gas molecules to be adsorbed onto the top surface of the substrate S.

Furthermore, the skirt wall portion 111c of the shield 111 is provided between the substrate holder 103 and the inner wall of the chamber 101, and surrounds the side surface of the substrate holder 103. Since it is very costly to cool the entire chamber 101, the chamber 101 itself is not cooled in this embodiment. Accordingly, the inner wall of the chamber 101 has a higher temperature relative to the substrate holder 103. For this reason, when the cooled shield 111 is not provided around the substrate holder 103 as in the conventional case, the heat is transferred from the inner wall of the chamber 101 to the substrate holder 103 by way of radiation, and temperature distribution of the substrate holder 103 becomes unstable or non-uniform. On the other hand, in the substrate cooling device 100 of this embodiment, the skirt wall portion 111c of the cooled shield 111 is provided between the substrate holder 103 and the inner wall of the chamber 101. Accordingly, it is easy to suppress the heat transfer from the inner wall of the chamber 101 to the substrate holder 103, and to stabilize and homogenize in-plane temperature distribution of the substrate mounting surface 103a of the substrate holder 103. The skirt wall portion 111c does not always have to entirely surround the substrate holder 103 in its height direction. The skirt wall portion 111c can improve the temperature distribution of the substrate holder 103 just by surrounding at least part in the height direction of the substrate holder 103. Meanwhile, in order to further improve the temperature distribution of the substrate holder 103 while suppressing the thermal transfer between the shield 111 and the substrate holder 103, it is preferable to operate the substrate holder cooling unit 109 and the shield cooling unit 112 in such a way as to make the temperature of the substrate holder 103 substantially equal to the temperature of the shield 111.

The louver 115 is provided such that part of the side wall portion 111a and part of the skirt wall portion 111c of the shield 111 project in a plate-like fashion obliquely from a plane of the side wall portion 111a and of the skirt wall portion 111c. A base end of the louver 115 includes openings. This configuration makes it possible to achieve an effect of causing the shield 111 maintained at a low temperature to trap the gas molecules, and to discharge the gas molecules gasified in refresh processing to be described later from the inside to the outside of the shield 111 through the louver 115. Furthermore, the louver 115 is obliquely provided such that an angle defined between a plane including the louver 115 and the plane including the side wall portion 111a and the skirt wall portion 111c forms an acute angle on a plane side including the upper wall portion 111b. According to the above-described cosine law, even when the gas molecules are desorbed by the louver 115, the gas molecules are less likely to be directed toward the top surface of the substrate S but are more likely to be directed toward the upper wall portion 111b. Note that in FIG. 1, the opening 114 and the louver 115 are each formed at part of the side wall portion 111a, and that the upper wall portion 111b, the side wall portion 111a, and the skirt wall portion 111c are formed as a continuous member.

Figure 3:
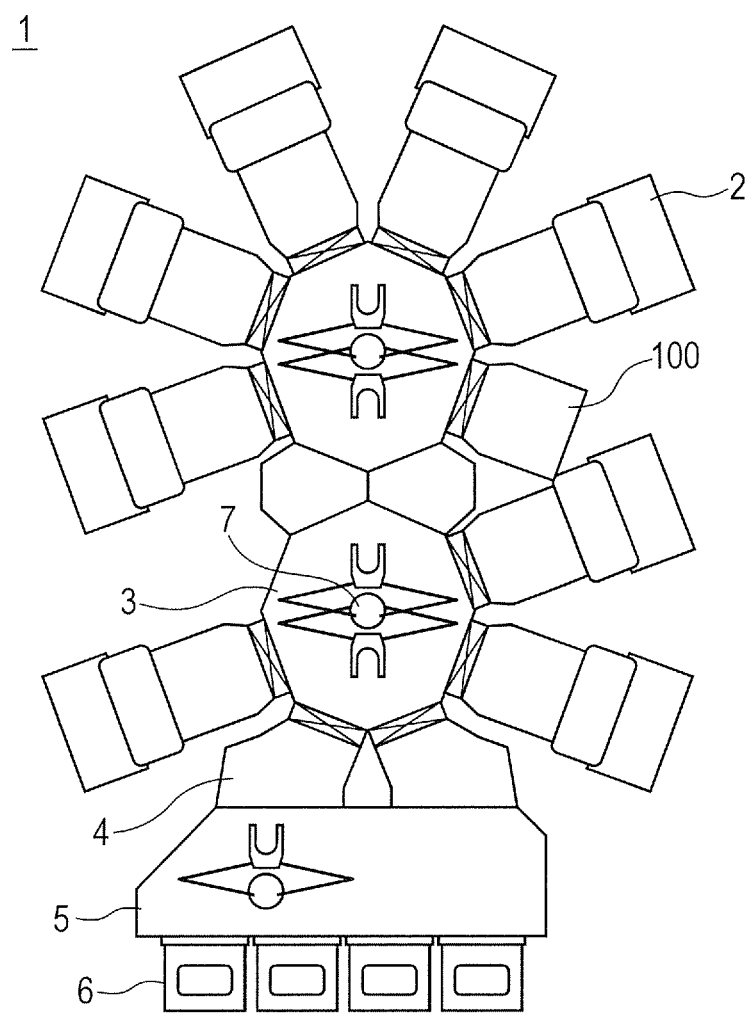
FIG. 3 is a schematic configuration diagram of a substrate processing system including the substrate cooling device according to the embodiment of the present invention.

FIG. 3 is a schematic configuration diagram of a substrate processing system 1 including the substrate cooling device 100 of this embodiment. The substrate processing system 1 is a cluster-type system which includes multiple substrate processing chambers 2, a load-lock chamber 4, and the substrate cooling device 100 of this embodiment. The multiple substrate processing chambers 2 may be configured to perform the same processing on the substrate S, or to perform different processing from one another. The multiple substrate processing chambers 2, the load-lock chamber 4, and the substrate cooling device 100 are connected to one another via conveyance chambers 3, and openable and closable gate valves are provided at respective junctions. A conveyance robot 7 is installed in each conveyance chamber 3. By driving the conveyance robots 7, the substrate S is conveyed to and from the substrate processing chambers 2, the load-lock chamber 4, and the substrate cooling device 100 in accordance with predetermined processing order. Each of the substrate processing chambers 2, the conveyance chambers 3, and the substrate cooling device 100 is provided with an exhaust pump, so that the substrate S can be conveyed to and from these chambers while keeping the chambers in vacuum. An autoloader 5 for supplying the substrate S is provided outside the load-lock chamber 4. The autoloader 5 is configured to take substrates one by one out of external cassettes 6 located in an airy side and containing multiple substrates, and to put the substrates into the load-lock chamber 4.

Figure 4:
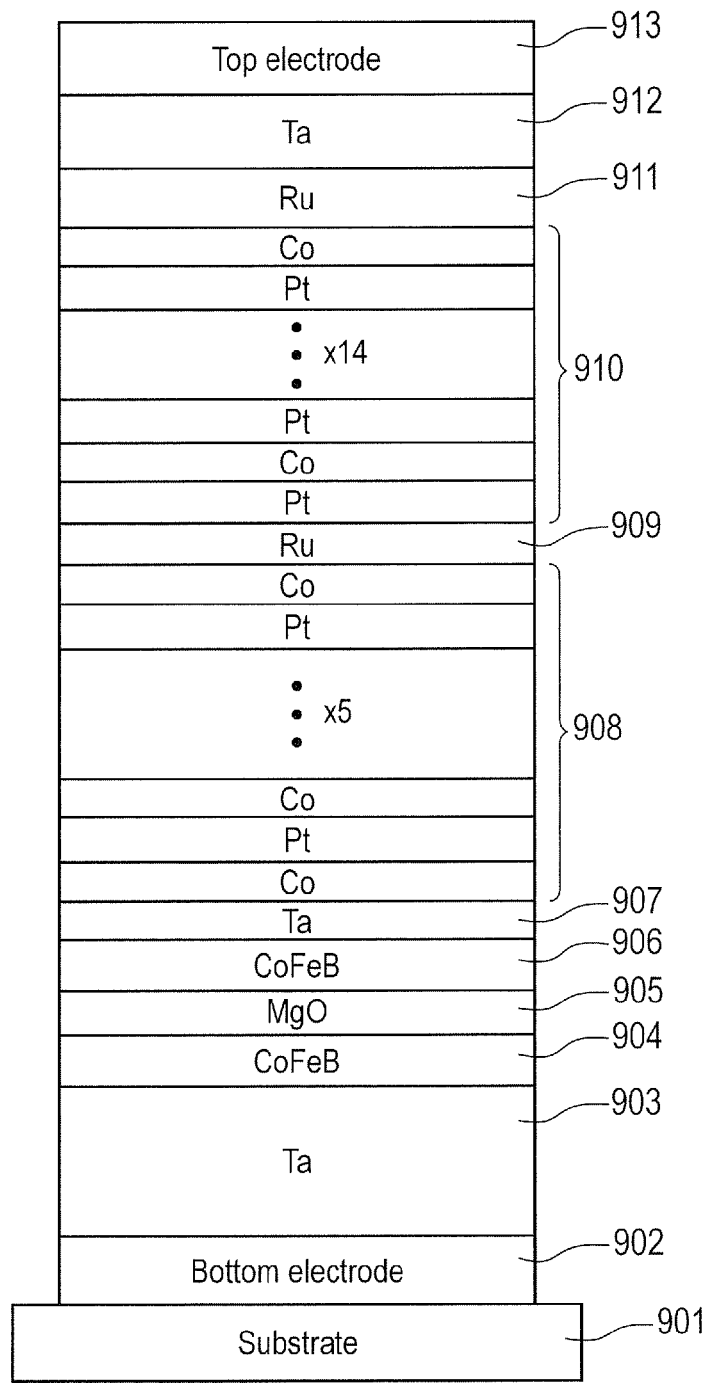
FIG. 4 is a schematic diagram showing an exemplary element configuration to perform cooling processing by using the substrate cooling device according to the embodiment of the present invention.

FIG. 4 is a schematic diagram showing a configuration of an exemplary MTJ (magnetic tunnel junction) element 900 for which cooling processing is performed by using the substrate cooling device 100 of this embodiment. The MTJ element is used in an MRAM (magnetic random access memory), a magnetic sensor, and the like.

The MTJ element 900 is a perpendicular magnetization-type element (a p-MTJ element). The MTJ element 900 includes a substrate 901, and moreover, a bottom electrode 902, a buffer layer (a Ta layer) 903, a free layer (a CoFeB layer) 904, and a tunnel barrier layer (a MgO layer) 905 are provided thereon in this order. Provided further in the order listed below on this MTJ element 900 are: a reference layer formed by stacking a CoFeB layer 906, an orientation separating layer (a Ta layer) 907, a first laminated body 908, a non-magnetic intermediate layer (a Ru layer) 909, and a second laminated body 910; a cap layer formed by stacking a Ru layer 911 and a Ta layer 912; and an top electrode 913. The MTJ element 900 is not limited to the above-described configuration. It is possible to use a configuration subjected to arbitrary changes including, an increase or decrease in the number of layers, changes in materials constituting the respective layers, vertical inversion of the stacking order of the layers, and the like within a scope that does not impair functions of the perpendicular magnetization-type element.

The cooling processing by using the substrate cooling device 100 of this embodiment is preferably conducted after the tunnel barrier layer (the MgO layer) 905 is formed on the free layer (the CoFeB layer) 904 and before the CoFeB layer 906 of the reference layer is formed on the tunnel barrier layer (the MgO layer) 905. By performing the cooling processing at this timing by use of the substrate cooling device 100, it is possible to improve a characteristic of the tunnel barrier layer 905 by the cooling and to suppress contamination of a top surface of the tunnel barrier layer 905 (i.e., an interface between the tunnel barrier layer 905 and the CoFeB layer 906) during the cooling. The cooling processing by use of the substrate cooling device 100 may be performed at any other arbitrary timing or at multiple timings.

An object to which the substrate cooling device 100 of this embodiment is to be applied is not limited to the MTJ element 900 of FIG. 4. The substrate cooling device 100 is suitably applicable to an arbitrary substrate or element which undergoes the cooling processing in vacuum.

According to the substrate cooling device 100 of this embodiment, the side wall portion 111a of the cooled shield 111 surrounds the lateral side of the substrate S or the substrate mounting surface 103a. Thus, it is possible to trap the gas molecules that are released when the substrate S approaches the substrate holder 103, and to reduce the contamination of the top surface of the substrate S by the gas molecules. Moreover, the upper wall portion 111b of the cooled shield 111 covers the upper side of the substrate S or the substrate mounting surface 103a. Thus, it is possible to trap the gas molecules, which are not trapped by the side wall portion 111a and are desorbed therefrom, with a high probability and to further reduce the contamination of the top surface of the substrate S by the gas molecules. Furthermore, the skirt wall portion 111c of the cooled shield 111 is located below the lateral side of the substrate S or the substrate mounting surface 103a and surrounds the lateral side of the substrate holder 103. Thus, it is possible to reduce the heat transfer between the inner wall of the chamber 101 and the substrate holder 103 by the radiation, and to stabilize and homogenize heat distribution of the substrate holder 103.

In addition, the shield heater 116 is provided in the vicinity of the surface on the inside of the shield 111. Meanwhile, the in-chamber heater 117 is provided in the vicinity of the inner side of the wall surface of the chamber 101. Accordingly, it is possible to impart thermal energy from the shield heater 116 and the in-chamber heater 117 to the gas molecules adsorbed onto the shield 111 and the chamber 101, and to remove the gas molecules therefrom.

Figure 5:
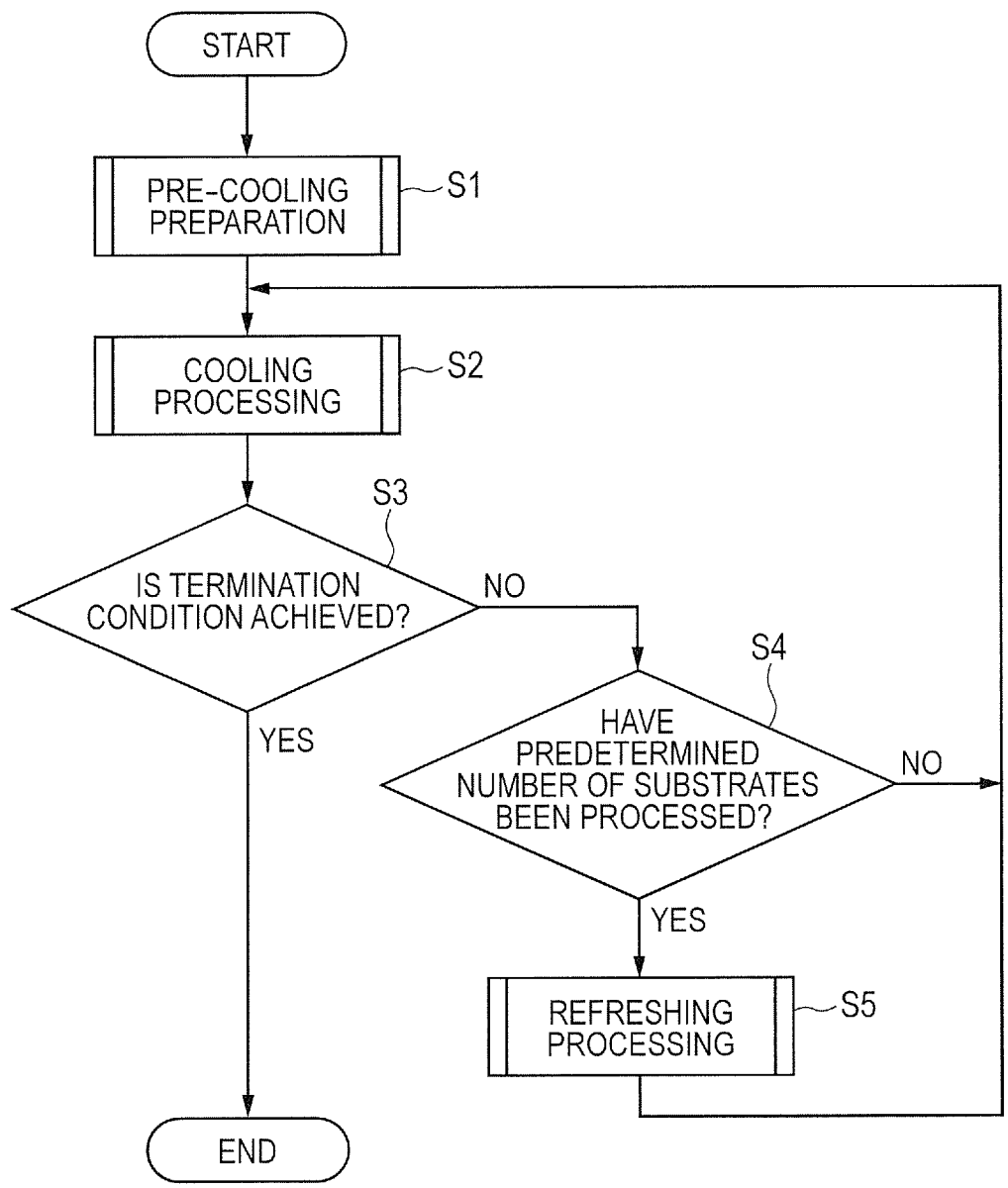
FIG. 5 is a diagram showing a flowchart of a substrate cooling method according to the embodiment of the present invention.

FIG. 5 is a diagram showing a flowchart of a substrate cooling method using the substrate cooling device 100 of this embodiment. The substrate cooling method described below is controlled by a not-illustrated control device included in the substrate cooling device 100. First, in the state where the substrate S is not located in the chamber 101, the substrate cooling device 100 performs pre-cooling preparation (step S1). After completion of the pre-cooling preparation, the substrate cooling device 100 conveys the substrate S into the chamber 101 and performs the cooling processing (step S2). After completion of the cooling processing, the substrate cooling device 100 terminates the substrate cooling method if a predetermined termination condition is achieved (YES in step S3). The predetermined termination condition can be arbitrarily determined, and examples thereof include conditions such as: that a termination instruction is inputted by a user; that processing of a predetermined number of substrates is completed; that there are no more substrates S to be processed next; and so forth.

Moreover, if the predetermined termination condition is yet to be achieved (NO in step S3) and a predetermined number (such as 10 to 20) of substrates counted from a point after execution of the previous refresh processing (or from the start of the substrate cooling method if the refresh processing is yet to be performed) have been subjected to the cooling processing (YES in step S4), then the substrate cooling device 100 performs the refresh processing (step S5). The refresh processing may instead be performed when an execution instruction is inputted by the user, or after a lapse of a predetermined time period from the execution of the previous refresh processing (or from the start of the substrate cooling method if the refresh processing is yet to be performed). Note that the refresh processing will be described in detail by using FIG. 8.

If the predetermined number of substrates are yet to be subjected to the cooling processing (NO in step S4) or after completion of the refresh processing (step S5), the substrate cooling device 100 conveys the next substrate S into the chamber 101 and repeats the cooling processing (step S2).

Figure 6:
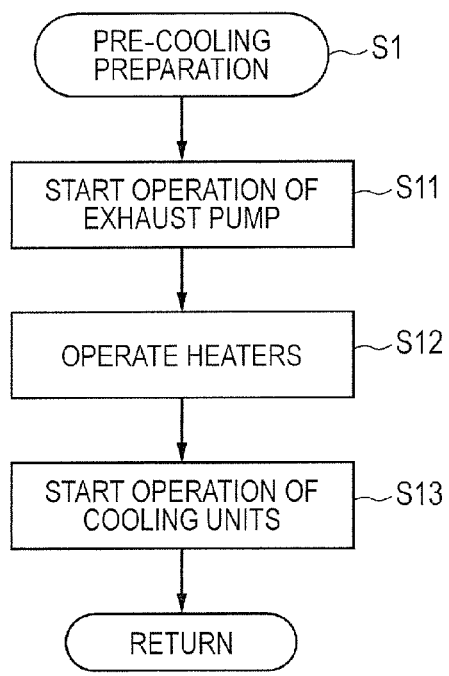
FIG. 6 is a diagram showing a detailed flowchart of pre-cooling preparation according to the embodiment of the present invention.

FIG. 6 is a diagram showing a detailed flowchart of the pre-cooling preparation (step S1) of this embodiment. First, in the state where the substrate S is not located in the chamber 101, the substrate cooling device 100 starts operation of the exhaust pump 120 (step S11). The substrate cooling device 100 keeps the exhaust pump 120 in operation until all the cooling processing is completed, and thus maintains the state of vacuum inside the chamber 101. After the chamber 101 reaches a predetermined degree of vacuum, i.e., a predetermined pressure, the substrate cooling device 100 operates the shield heater 116, the in-chamber heater 117, and the ex-chamber heater 118, and then stops these heaters after a lapse of a predetermined time period (step S12). Thus, it is possible to gasify the gas molecules and the like adsorbed onto the inner wall of the chamber 101 and the shield 111, to discharge the gas molecules from the exhaust pump 120, and thereby to reduce contamination of the substrate S that would occur in the cooling processing. Thereafter, the substrate cooling device 100 starts operation of the substrate holder cooling unit 109 and the shield cooling unit 112 (step S13). The substrate cooling device 100 terminates the pre-cooling preparation after each of the substrate holder 103 and the shield 111 is cooled to a predetermined temperature.

Figure 7:
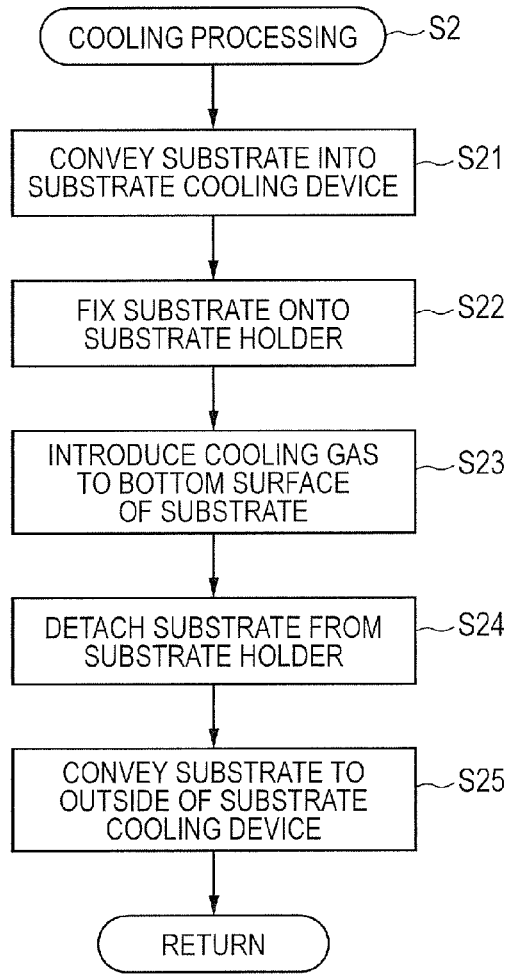
FIG. 7 is a diagram showing a detailed flowchart of cooling processing according to the embodiment of the present invention.

FIG. 7 is a diagram showing a detailed flowchart of the cooling processing (step S2) of this embodiment. First, the substrate cooling device 100 opens the gate valve 102 and conveys the substrate S from the outside into the substrate cooling device 100 (step S21). In this embodiment, the conveyance of the substrate S is carried out by the conveyance robot 7 in the conveyance chamber 3 connected to the substrate cooling device 100. Instead, the conveyance robot 7 to convey the substrate S may be provided inside the substrate cooling device 100. In this case, the lift pin 104 of the substrate holder 103 is in a state elevated by the lift pin drive mechanism 105, and the conveyance robot 7 disposes the substrate S on the elevated lift pin 104. Then, the substrate cooling device 100 closes the gate valve 102.

Thereafter, the substrate cooling device 100 lowers the lift pin 104 by using the lift pin drive mechanism 105. Thus, the substrate S is mounted on the substrate mounting surface of the substrate holder 103 which is in the cooled state, and the substrate S is fixed by lowering the mechanical chuck 106 with the mechanical chuck drive mechanism 107 (step S22). In this case, when the substrate S approaches the substrate mounting surface 103$a$ (when a clearance between the substrate S and the substrate mounting surface 103$a$ reaches a distance in a range of about 10 mm to 20 mm, for example) during the lowering of the lift pin 104, it is preferable to stop the lift pin 104 once and to resume the lowering of the lift pin 104 after a lapse of a predetermined time period. In this way, it is possible to prevent the substrate S from causing a deformation or a crack as a consequence of bringing the substrate S into sudden contact with the substrate holder 103. Note that the shield 111 needs to be at least in the cooled state when the substrate S is mounted on the substrate mounting surface 103$a$ of the substrate holder 103. Naturally, it is preferable that the shield 111 be cooled when the substrate S is conveyed into the substrate cooling device 100.

After the substrate S is fixed to the substrate mounting surface 103$a$, the substrate cooling device 100 introduces the cooling gas from the cooling gas introduction unit 123 into the space between the substrate S and the substrate mounting surface 103$a$, and stands by until the cooling of the substrate S is completed (step S23). The completion of the cooling of the substrate S may be determined based on a lapse of a predetermined time period, or by providing the substrate cooling device 100 with an arbitrary temperature measurement unit and thereby measuring the temperature of the substrate S. Thereafter, the introduction of the cooling gas is stopped and the cooling gas is discharged from the space between the substrate S and the substrate mounting surface 103$a$ by using the exhaust pump 120.

After the completion of the cooling of the substrate S, the substrate S on the substrate holder 103 is detached therefrom by elevating the mechanical chuck 106 by using the mechanical chuck drive mechanism 107 and elevating the lift pin 104 by using the lift pin drive mechanism 105 (step S24). The substrate cooling device 100 opens the gate valve 102, and conveys the substrate S to the outside of the substrate cooling device 100 (step S25). As with step S21, the conveyance of the substrate S is carried out by the conveyance robot 7 in the conveyance chamber 3 connected to the substrate cooling device 100. Then, the substrate cooling device 100 closes the gate valve 102 and terminates the cooling processing. When the cooling processing is subsequently performed on the next substrate S, the next substrate S may be conveyed into the substrate cooling device 100 before closing the gate valve 102.

Figure 8:
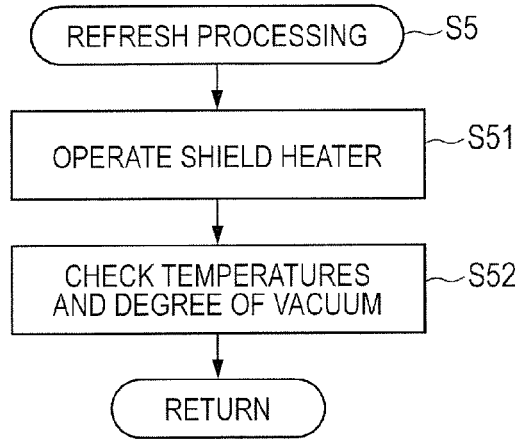
FIG. 8 is a diagram showing a detailed flowchart of refresh processing according to the embodiment of the present invention.

FIG. 8 is a diagram showing a detailed flowchart of the refresh processing (step S5) of this embodiment. As the cooling processing of the substrates S is performed several times, the gas molecules are brought little by little from the outside into the substrate cooling device 100, and the gas molecules adsorbed onto the substrate holder 103 and the shield 111 are gradually increased. As a consequence, the substrates S face a growing risk of contamination by desorption of the adsorbed gas molecules. For this reason, every time the substrate cooling device 100 performs a prescribed number of times of the cooling processing on the substrates S, the substrate cooling device 100 performs the refresh processing to operate the shield heater 116 provided in an internal space of the shield 111 and thus to gasify and remove the gas molecules. First, in the state where the substrate S is not located in the chamber 101, the substrate cooling device 100 operates the shield heater 116 (step S51). In this embodiment, the shield heater 116 is operated for several seconds and is then stopped. Thus, the shield heater 116 can gasify the gas molecules, which are adsorbed onto the substrate holder 103 and the inner wall of the shield 111, by imparting thermal energy to the gas molecules, and discharge the gas molecules to the outside of the shield 111 through the louver 115. The gas molecules are further discharged from the exhaust pump 120 to the outside of the substrate cooling device 100. After the shield heater 116 is operated and stopped, the temperatures of the substrate holder 103 and the shield 111 and the degree of vacuum inside the chamber 101 are checked. The refresh processing is terminated when the temperatures and the degree of vacuum reach prescribed values, respectively (step S52).

In this embodiment, the control device included in the substrate cooling device 100 performs the control of start and end of each of the steps shown in the flowcharts of FIGS. 5 to 8. Instead, the substrate cooling device 100 may be controlled by a control device provided separately from the substrate cooling device 100. Meanwhile, a user may expressly instruct the substrate cooling device 100 to start and end part or all of the steps. Alternatively, the user may execute part or all of the steps by himself or herself.

Second Embodiment

Figure 9:
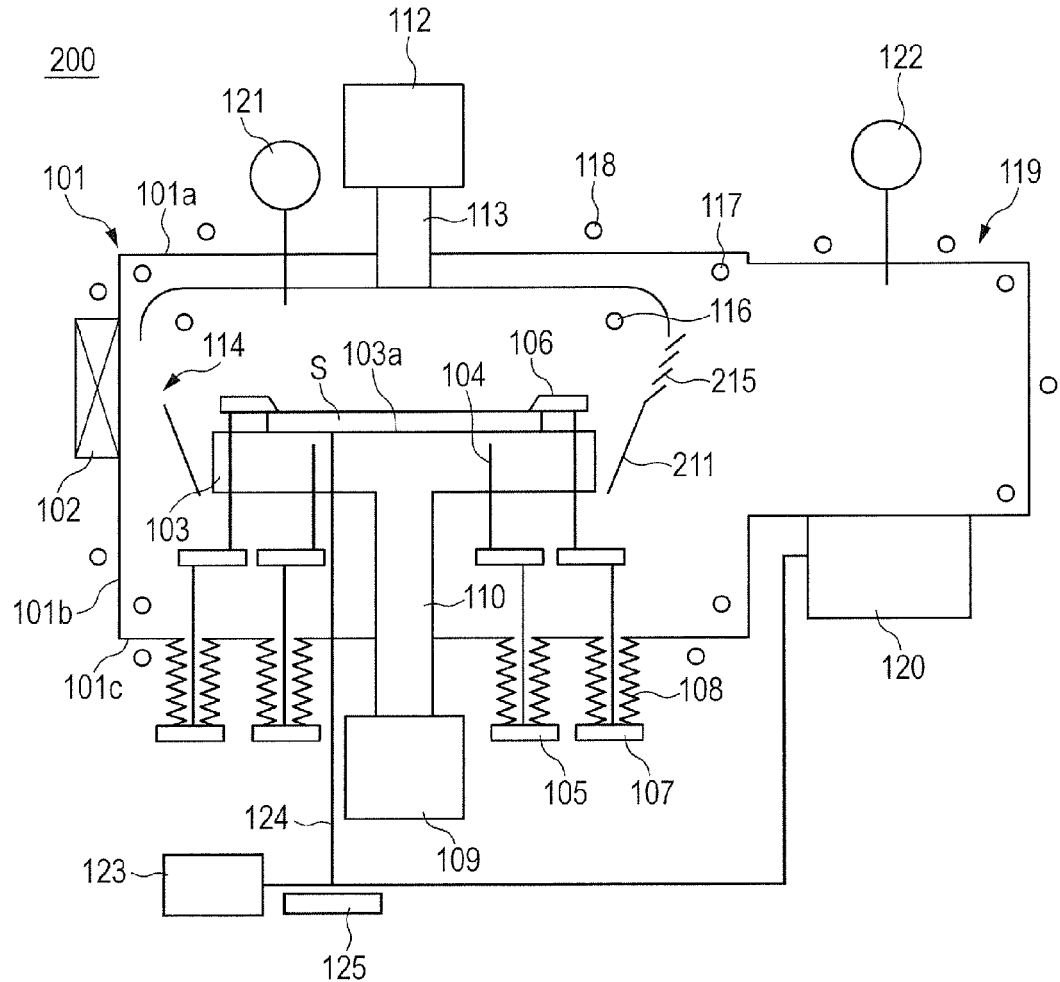
FIG. 9 is a schematic configuration diagram showing a substrate cooling device according to an embodiment of the present invention.

FIG. 9 is a schematic configuration diagram showing a substrate cooling device 200 of this embodiment, which serves as the substrate processing device configured to cool a substrate. The only different feature of the substrate cooling device 200 from the substrate cooling device 100 of the first embodiment is a configuration of a shield 211. The rest of the configuration of the substrate cooling device 200 remains the same.

Figure 10:
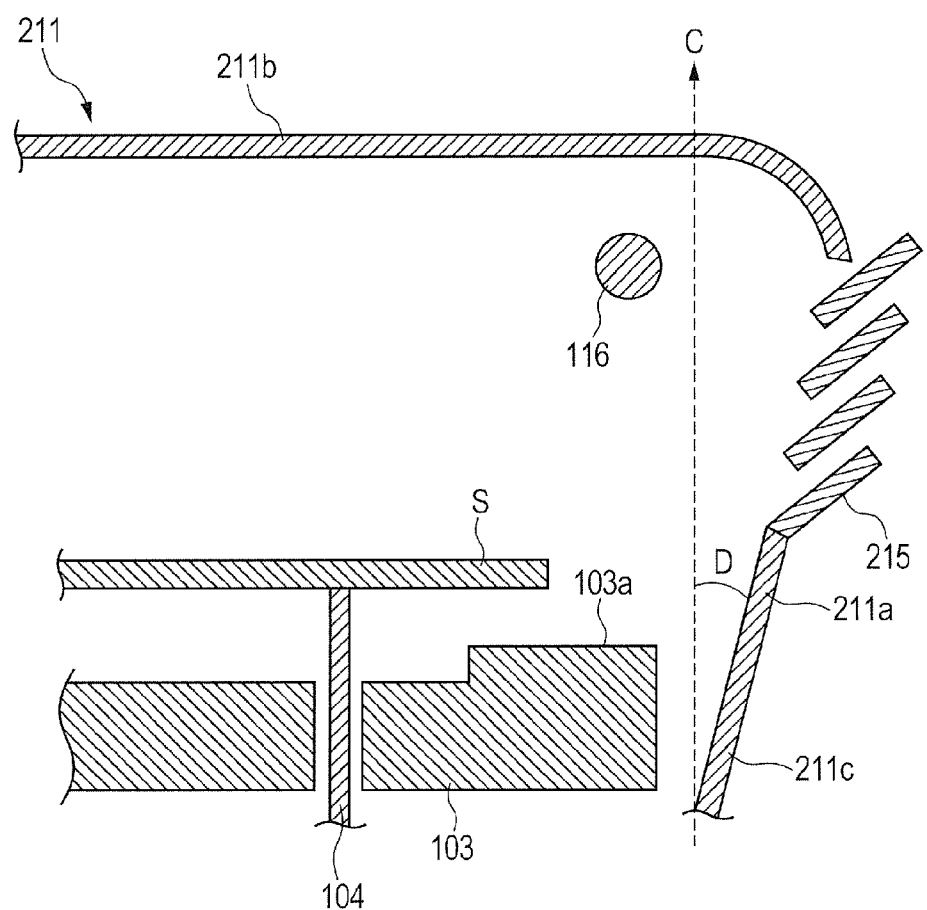
FIG. 10 is a cross-sectional view of a shield according to the embodiment of the present invention.

FIG. 10 is a cross-sectional view of the shield 211 included in the substrate cooling device 200 of this embodiment. The shield 211 includes: a side wall portion 211$a$ which surrounds the lateral side of the substrate S or the substrate mounting surface 103$a$; an upper wall portion 211$b$ which covers the upper side of the substrate S or the substrate mounting surface 103$a$; and a skirt wall portion 211$c$ which is located below the lateral side of the substrate S or the substrate mounting surface 103$a$ and surrounds the lateral side of the substrate holder 103. A difference from the shield 111 according to the first embodiment is that the side wall portion 211$a$ is obliquely provided. Specifically, when an angle formed by the side wall portion 211$a$ relative to a normal direction C of the substrate S or the substrate mounting surface 103$a$ is defined as D (assuming that D is equal to 0° with respect to the normal line of the substrate S or the substrate mounting surface 103$a$, and a direction away from the substrate S or the substrate mounting surface 103$a$ is defined as a positive direction), the side wall portion 211a is inclined in such a way as to satisfy 0°<D<90°. In other words, in the shield 211, a range from an outer peripheral part of the upper wall portion 211b to the side wall portion 211a is provided in a continuously (i.e., smoothly) inclined manner, and a diameter of the side wall portion 211a is made smaller than a diameter of the outer peripheral part of the upper wall portion 211b. For this reason, a plane including the upper wall portion 211b and a plane including the side wall portion 211a form an acute angle on the substrate holder side. In this embodiment, the skirt wall portion 211c is provided flush with the side wall portion 211a. As a consequence, the skirt wall portion 211c is inclined as with the side wall portion 211a.

According to the cosine law, by inclining the side wall portion 211a of the shield 211, the gas molecules to be desorbed from the side wall portion 211a are most probable to fly in the normal direction of the side wall portion 211a. Specifically, the side wall portion 211a is provided such that, when the gas molecules trapped on the side wall portion 211a are released, the gas molecules are most probably directed to a direction to approach the upper wall portion 211b, i.e., a direction away from the substrate mounting surface 103a. For this reason, when the gas molecules are desorbed from the side wall portion 211a, the probability that the gas molecules are directed toward the top surface of the substrate S is further reduced, while the probability of the gas molecules to be directed toward the upper wall portion 211b is increased. As a consequence, the probability that the gas molecules are trapped on the upper wall portion 211b is increased. Thus, it is possible to further reduce the contamination of the top surface of the substrate S by the gas molecules.

A louver 215 is provided such that part of the side wall portion 211a and the skirt wall portion 211c, which are inclined, project in a plate-like fashion obliquely from a plane of the side wall portion 211a and of the skirt wall portion 211c. A base end of the louver 215 includes openings. The louver 215 is obliquely provided with an acute angle formed with a direction from the side wall portion 211a and the skirt wall portion 211c toward the upper wall portion 211b. According to the above-described configuration, even when the gas molecules are desorbed by the louver 215, the gas molecules are less likely to be directed toward the top surface of the substrate S but are more likely to be directed toward the upper wall portion 211b.

Third Embodiment

Figure 11:
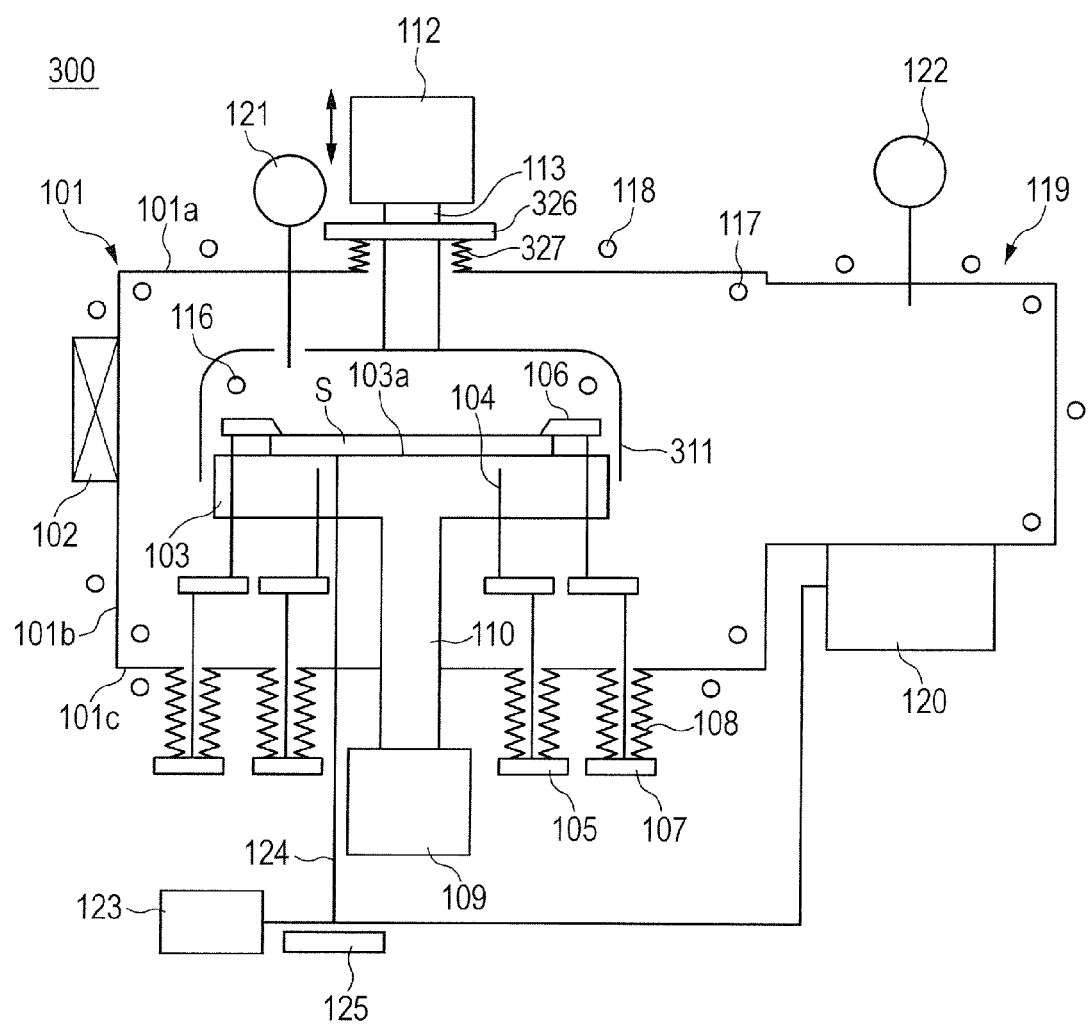
FIG. 11 is a schematic configuration diagram showing a substrate cooling device according to an embodiment of the present invention.

FIG. 11 is a schematic configuration diagram showing a substrate cooling device 300 of this embodiment, which serves as the substrate processing device configured to cool a substrate. The only different feature of the substrate cooling device 300 from the substrate cooling device 100 of the first embodiment is a configuration of a shield 311. The rest of the configuration of the substrate cooling device 300 remains the same.

In the substrate cooling device 300, the shield 311 can be elevated and lowered along the normal direction of the substrate S or the substrate mounting surface 103a by a shield drive mechanism 326. The shield drive mechanism 326 is arbitrary driving means such as a motor and an actuator. An expandable bellows 327 is provided between the shield 311 and the shield drive mechanism 326 so that the shield 311 can move while maintaining the hermetically sealed state of the chamber 101.

Unlike the first embodiment, the shield 311 is not provided with the opening 114 or the louver 115. At the time of conveyance of the substrate S, the shield 311 without the opening 114 is moved upward (i.e., in a direction away from the substrate S or the substrate mounting surface 103a) so that the substrate S can be conveyed. In the meantime, at the time of the refresh processing, the shield 311 without the louver 115 is moved upward so that the gas molecules released from the top surface of the substrate holder 103 can be discharged. As described above, since the shield drive mechanism 326 that can elevate and lower the shield 311 is provided in this embodiment, it is possible to simplify the configuration of the shield 311. Moreover, since the opening 114 and the louver 115 are not provided, it is possible to further reduce the probability of contamination of the top surface of the substrate S by invasion of the gas molecules from the outside to the inside of the shield 311 during the cooling.

When the substrate S is cooled by using the substrate cooling device 300, the substrate cooling device 300 first elevates the shield 311 by using the shield drive mechanism 326, and then moves the substrate S to a position located above the substrate mounting surface 103a and out of contact with the substrate mounting surface 103a. Thereafter, the shield 311 is lowered by using the shield drive mechanism 326, and then the substrate S is mounted on the substrate mounting surface 103a. In this state, the substrate cooling device 300 stands by for a predetermined time period to cool the substrate. As described above, by lowering the shield 311 before the substrate S comes into contact with the substrate mounting surface 103a, the shield 311 can trap the gas molecules which are released from the substrate holder 103 when the substrate S is lowered.

The present invention is not limited to the above-described embodiments but various changes are possible within the scope not departing from the gist of the present invention. The embodiments have been described above as being related to the substrate cooling device and the substrate cooling method for the substrate provided with the MTJ element. However, the object to which the present invention is to be applied is not limited to a specific element. The present invention can be used as the substrate cooling device and the substrate cooling method configured to perform cooling of an arbitrary substrate in vacuum.

The embodiments have been described above on the assumption that the direction of the gravity represents the vertical direction. However, the directions to configure the device are arbitrary. When the substrate cooling device according to each of the above-described embodiments is installed by tilting the device at 90° (i.e., when the top surface of the substrate S is fixed in alignment with the direction of the gravity), the vertical direction in each of the above-described embodiments should be read as a direction perpendicular to the direction of the gravity.

The invention claimed is:
1. A substrate processing device comprising:
  a chamber with an exhaust unit configured to evacuate inside the chamber;
  a substrate holder provided inside the chamber and including a substrate mounting surface configured to cool a substrate;
  a shield provided inside the chamber and including a side wall portion provided to surround a lateral side of the substrate mounting surface;
  a shield cooling unit configured to cool the shield; and
  a control device configured to control the shield cooling unit to cool the shield before the substrate is mounted on the substrate mounting surface.

2. The substrate processing device according to claim 1, wherein the shield further comprises an upper wall portion opposed to the substrate mounting surface.

3. The substrate processing device according to claim 2, wherein a range from an outer peripheral part of the upper wall portion to the side wall portion is provided in a continuously inclined manner, and a diameter of the shield in the side wall portion made smaller than a diameter of the shield in the outer peripheral part of the upper wall portion.

4. The substrate processing device according to claim 1, wherein the shield further comprises a skirt wall portion to surround a lateral part of the substrate holder.

5. The substrate processing device according to claim 1, further comprising:
   a heater located on the substrate holder side of the shield.

6. A method of cooling the substrate by using the substrate processing device according to claim 1, comprising the steps of:
   mounting the substrate on the substrate mounting surface; and
   cooling the substrate in a state where the substrate holder and the shield are cooled.

7. A method of performing maintenance of the substrate processing device according to claim 5, comprising the step of:
   operating the heater in a state where the substrate is not located in the chamber.

8. The method according to claim 7, wherein the step of operating the heater is performed between a step of cooling a first substrate using the substrate processing device and a step of cooling a second substrate using the substrate processing device.

9. The substrate processing device according to claim 1, further comprising:
   a shield drive mechanism configured to elevate and lower the shield along a normal direction of the substrate mounting surface.

10. A method of cooling the substrate by using the substrate processing device according to claim 9, comprising the steps of:
    moving the substrate to a position located above the substrate mounting surface but not in contact with the substrate mounting surface in a state where the shield is elevated by using the shield drive mechanism;
    lowering the shield by using the shield drive mechanism;
    mounting the substrate on the substrate mounting surface; and
    cooling the substrate in a state where the substrate holder and the shield are cooled.

11. The substrate processing device according to claim 1, wherein the control device is configured to control the shield cooling unit to cool the shield when a plasma is not generated in the chamber.

* * * * *